US012571627B2

(12) United States Patent
Li

(10) Patent No.: US 12,571,627 B2
(45) Date of Patent: Mar. 10, 2026

(54) LASER EMITTER, DEPTH CAMERA AND ELECTRONIC DEVICE

(71) Applicant: Beijing Xiaomi Mobile Software Co., Ltd., Beijing (CN)

(72) Inventor: Hui Li, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 1062 days.

(21) Appl. No.: 17/646,404

(22) Filed: Dec. 29, 2021

(65) Prior Publication Data

US 2022/0412726 A1    Dec. 29, 2022

(30) Foreign Application Priority Data

Jun. 29, 2021    (CN) .......................... 202110726895.7

(51) Int. Cl.
| | |
|---|---|
| *G01B 11/22* | (2006.01) |
| *G02B 26/08* | (2006.01) |
| *G02B 27/30* | (2006.01) |
| *H01S 5/00* | (2006.01) |

(52) U.S. Cl.
CPC .......... *G01B 11/22* (2013.01); *G02B 26/0875* (2013.01); *G02B 27/30* (2013.01); *H01S 5/0071* (2013.01)

(58) Field of Classification Search
CPC .... G01B 11/22; G02B 26/0875; H01S 5/0071
See application file for complete search history.

(56) References Cited

U.S. PATENT DOCUMENTS

| | | | |
|---|---|---|---|
| 2010/0046953 A1* | 2/2010 | Shaw | ...................... H01S 5/423 |
| | | | 398/115 |
| 2016/0169488 A1* | 6/2016 | Canini | ................... H05K 1/183 |
| | | | 362/382 |
| 2016/0182895 A1 | 6/2016 | Ko et al. | |

(Continued)

FOREIGN PATENT DOCUMENTS

| | | |
|---|---|---|
| CN | 107688186 A | 2/2018 |
| CN | 212694038 U | 3/2021 |
| CN | 113747140 A | 12/2021 |

(Continued)

OTHER PUBLICATIONS

Motamedi, M. et al., "Miniaturized micro-optical scanners," Optical Engineering, vol. 33, No. 11, Nov. 1, 1994,8 pages.

(Continued)

*Primary Examiner* — George G. King
*Assistant Examiner* — Natasha Nigam
(74) *Attorney, Agent, or Firm* — McCoy Russell LLP

(57) ABSTRACT
A laser emitter includes an emitting assembly and a laser deflection assembly, wherein the emitting assembly that has a beam outlet, and the beam outlet is configured to emit a laser beam, the laser deflection assembly that is at the beam outlet and is movable relative to the beam outlet, the laser deflection assembly is configured to change an angle of deviation of the laser beam emitted from the beam outlet when the laser deflection assembly is translated relative to the beam outlet, and an included angle is between a translation direction of the laser deflection assembly and a center line of the laser beam emitted from the beam outlet.

20 Claims, 6 Drawing Sheets

(56) References Cited

U.S. PATENT DOCUMENTS

| 2019/0154809 A1* | 5/2019 | Akkaya | G02B 27/30 |
| 2021/0311171 A1* | 10/2021 | Richards | G02B 26/101 |

FOREIGN PATENT DOCUMENTS

| WO | WO-2019025222 A1 * | 2/2019 | G01S 17/42 |
| WO | 2020030916 A1 | 2/2020 | |

OTHER PUBLICATIONS

Tholl, H., "Novel Laser Beam Steering Techniques," Proceedings of SPIE 6397, Technologies for Optical Countermeasures III, Optics/Photonics in Security and Defence, Oct. 5, 2006, Stockholm, Sweden, 14 pages.

Bourderionnet, J. et al., "Continuous laser beam steering with micro-optical arrays-Experimental results," Proceedings of SPIE 7113, Electro-Optical and Infrared Systems: Technology and Applications V, Oct. 2, 2008, Cardiff, Wales, United Kingdom, 11 pages.

"Apple adopts ToF technology for commercial acceleration," dfcfw Website, Available Online at https://pdf.dfcfw.com/pdf/H3_AP202203011549916086_1.pdf, Available as Early as Apr. 6, 2020, 22 pages. (Submitted with English Translation).

* cited by examiner

12

11

24

22    22a    23    25    21

LASER EMITTER, DEPTH CAMERA AND ELECTRONIC DEVICE

CROSS REFERENCE TO RELATED APPLICATION

The present application claims priority to Chinese Patent Application No. 202110726895.7 filed on Jun. 29, 2021. The entire contents of the above-listed application are hereby incorporated by reference for all purposes.

BACKGROUND

A depth camera, belonging to a 3D camera, can detect the depth of field of a shooting space.

In the related art, a depth camera mainly includes a laser emitter and a laser receiving module. The laser emitter is used to emit a laser beam to a target object, and the laser receiving module is used to receive the reflected laser beam. In order to increase the field of view of the emitted laser beam, it is necessary to increase the optical power of the laser beam, that is, increase the electric power of the laser emitter.

However, as the electric power of the laser emitter increases, the laser emitter will generate more heat, which brings up higher requirements on the heat dissipation performance of the depth camera and is not conducive to the long-time operation of the depth camera.

SUMMARY

The disclosure relates to the technical field of electronics, and relates to a laser emitter, a depth camera and an electronic device.

According to a first aspect of the disclosure, a laser emitter is provided, and including:

an emitting assembly has a beam outlet, and the beam outlet is configured to emit a laser beam;

a laser deflection assembly is at the beam outlet and is movable relative to the beam outlet, the laser deflection assembly is configured to change an angle of deviation of the laser beam emitted from the beam outlet when the laser deflection assembly is translated relative to the beam outlet, and an included angle is between a translation direction of the laser deflection assembly and a center line of the laser beam emitted from the beam outlet.

According to a second aspect of the disclosure, a depth camera is provided, and including:

a laser emitter according to the first aspect of the disclosure; and a laser receiving module and the laser emitter are arranged side by side.

According to a third aspect of the disclosure, an electronic device is provided, and including:

a shell; and a depth camera according to the second aspect of the disclosure, and the depth camera is in the shell.

BRIEF DESCRIPTION OF THE FIGURES

In order to illustrate the technical solutions in some embodiments of the disclosure, the accompanying drawings required in the description of embodiments will be briefly described below. The accompanying drawings in the description below are some embodiments of the disclosure, and those of ordinary skill in the art can obtain other accompanying drawings according to these drawings without any creative work.

DETAILED DESCRIPTION

In order to make the objectives and technical solutions of the disclosure clearer, the embodiments of the disclosure will be described in further detail below in conjunction with the accompanying drawings.

A depth camera, belonging to a 3D camera, can detect the depth of field of a shooting space.

In the related art, depth cameras mainly include the following three types: structured light depth cameras, binocular stereo vision depth cameras and optical time-of-flight depth cameras.

The optical time-of-flight depth camera refers to the TOF (Time of flight) camera, mainly including a laser emitter and a laser receiving module. The laser emitter is configured to emit a laser beam to a target object, and the laser receiving module is configured to receive the reflected laser beam. The time difference between the emitted laser beam and the received laser beam is used to calculate the depth of field of the target object. In order to make the laser beam irradiate more target objects, the field of view of the emitted laser beam needs to be increased, and thus, the optical power of the laser beam needs to be increased, that is, the electric power of the laser emitter is increased.

However, as the electric power of the laser emitter increases, the laser emitter will generate more heat, which brings up higher requirements on the heat dissipation performance of the depth camera and is not conducive to the long-time operation of the depth camera.

Figure 1:
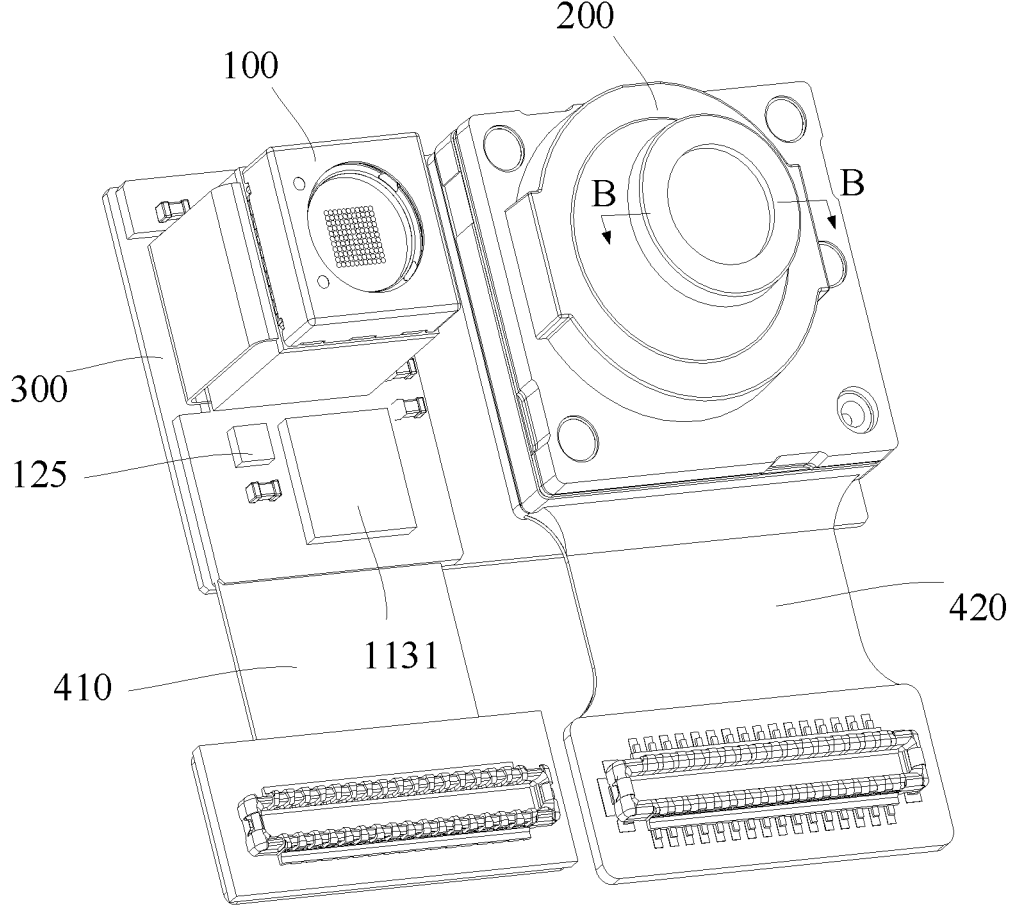
FIG. 1 is a structural schematic diagram of a depth camera according to an embodiment of the disclosure.

In order to solve the above technical problems, embodiments of the disclosure provide a depth camera. FIG. 1 is a structural schematic diagram of the depth camera. As shown in FIG. 1, the depth camera includes a laser emitter 100 (also called laser transmitter) and a laser receiving module 200. The laser receiving module 200 and the laser emitter 100 are arranged side by side. The laser emitter 100 can change an angle of deviation of the laser beam, and thus, can adjust the irradiation direction of the laser beam, which is equivalent to realizing scanning of the laser beam within a certain angle, that is, increasing the field of view of the laser beam.

Besides, since changing the angle of deviation of the laser beam does not need to increase the optical power of the laser beam, the electric power of the laser emitter 100 will not be increased, thus the overheating problem is solved, and the depth camera can operate for a long time. In addition, when the electric power remains unchanged, the power consumption of the depth camera will not increase, and the power conversion efficiency will not decrease, so that the performance of the depth camera is ensured.

As mentioned above, it can be known that the reason why the depth camera can increase the field of view of the laser beam without increasing the optical power of the laser beam is that the laser emitter 100 can change the angle of deviation of the emitted laser beam, which will be explained below.

Figure 2:
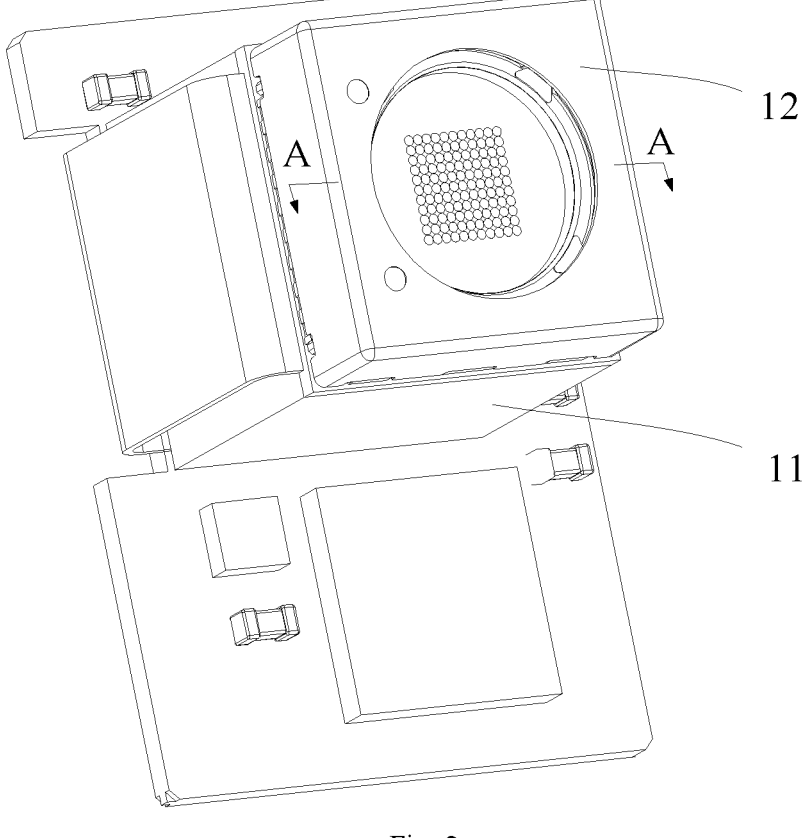
FIG. 2 is a structural schematic diagram of a laser emitter according to an embodiment of the disclosure.

FIG. 2 is a structural schematic diagram of the laser emitter 100. With reference to FIG. 2, in an embodiment, the laser emitter 100 may include an emitting assembly 11 and a laser deflection assembly 12.

Figure 3:
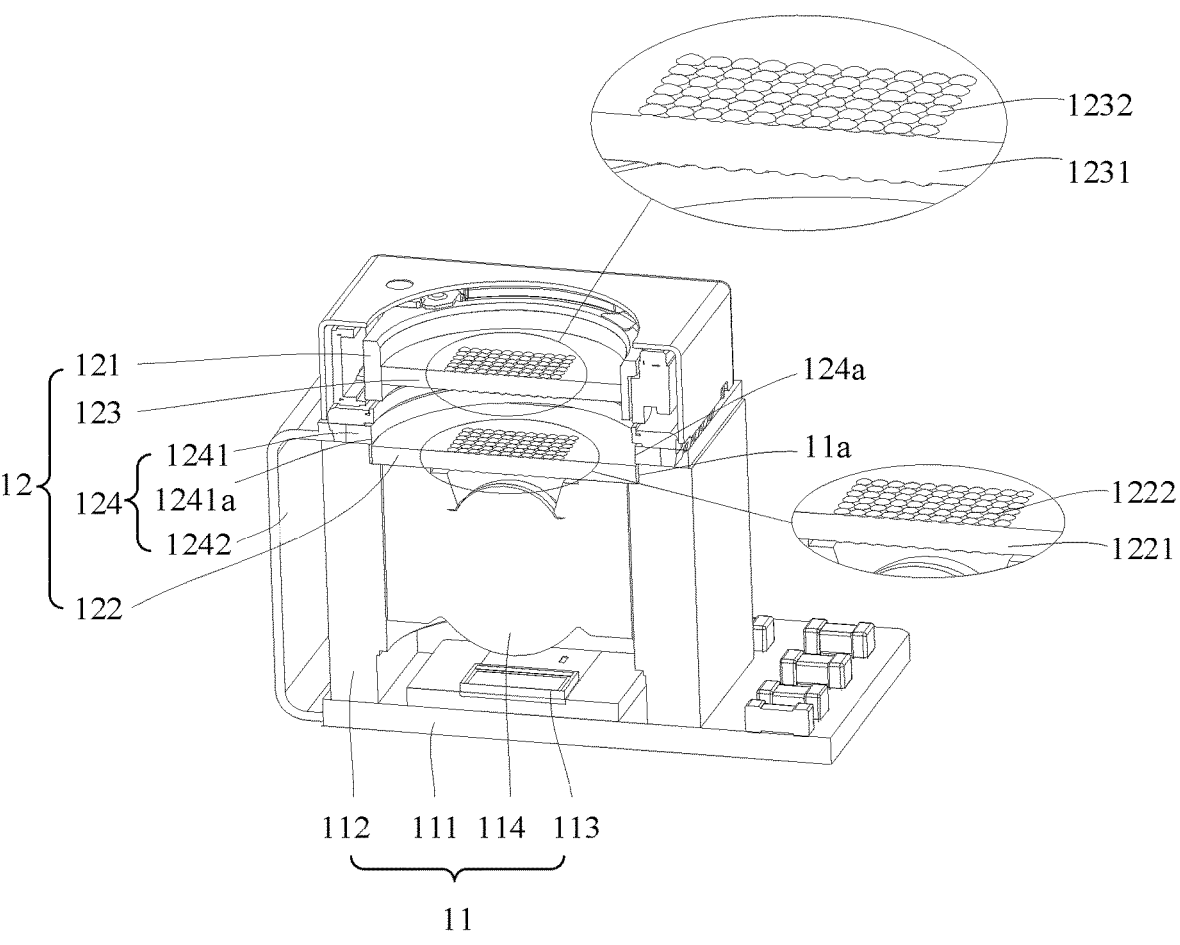
FIG. 3 is a sectional view of FIG. 2 taken along line A-A according to an embodiment of the disclosure.

FIG. 3 is a sectional view of FIG. 2 taken along line A-A. With reference to FIG. 3, the emitting assembly 11 is provided with a beam outlet 11a, and the beam outlet 11a is configured to emit a laser beam. The laser deflection assembly 12 is located at the beam outlet 11a and is movable relative to the beam outlet 11a, the laser deflection assembly 12 is configured to change the angle of deviation of the laser beam emitted from the beam outlet 11a when the laser deflection assembly 12 is translated relative to the beam outlet 11a, and an included angle is formed between a translation direction of the laser deflection assembly 12 and a center line of the laser beam emitted from the beam outlet 11a.

When the laser emitter 100 according to the disclosure is used to emit the laser beam, the laser beam is emitted from the beam outlet 11a of the emitting assembly 11 and passes through the laser deflection assembly 12. When the laser beam passes through the laser deflection assembly 12, since the laser deflection assembly can change the angle of deviation of the laser beam by translating its position relative to the beam outlet, the irradiation direction of the laser beam can be adjusted, which is equivalent to realizing scanning of the laser beam within a certain angle, that is, increasing the field of view of the laser beam.

Besides, since the laser emitter 100 according to the disclosure does not increase the optical power of the laser beam in the process of increasing the field of view of the laser beam, the electric power of the laser emitter 100 will not be increased, the overheating problem does not exist, and the depth camera can operate for a long time.

It should be noted that "an included angle is formed between the translation direction of the laser deflection assembly 12 and the center line of the laser beam emitted from the beam outlet 11a" means that the translation direction of the laser deflection assembly 12 is different from the direction of the center line of the laser beam emitted from the beam outlet 11a. In an embodiment of the disclosure, the translation direction of the laser deflection assembly 12 may be perpendicular to the center line of the laser beam emitted from the beam outlet 11a. This design allows the laser deflection assembly 12 to be translated for a small distance to achieve large deflection of the laser beam.

It can be seen that the laser deflection assembly 12 plays a key role in the process of increasing the field of view of the laser beam. The laser deflection assembly 12 will be further described below.

Referring to FIG. 3, in an embodiment, the laser deflection assembly 12 may include a first lens array assembly 122 and a second lens array assembly 123.

The first lens array assembly 122 is located at the beam outlet 11a, the second lens array assembly 123 is located at a side of the first lens array assembly 122 facing away from the emitting assembly 11, and the second lens array assembly 123 is capable of being translated relative to the first lens array assembly 122.

In the above embodiment, since the first lens array assembly 122 is located in the beam outlet 11a and the second lens array assembly 123 is located at the side of the first lens array assembly 122 facing away from the emitting assembly 11, the laser beam emitted from the emitting assembly 11 can be transmitted through the first lens array assembly 122 and the second lens array assembly 123 sequentially, and finally emitted out of the laser emitter.

When the second lens array assembly 123 is in the original position, the laser beam is transmitted through the first lens array assembly 122 and the second lens array assembly 123 sequentially, and the laser beam will not be deflected. When the second lens array assembly is laterally translated relative to the first lens array assembly 122, since the position of the second lens array assembly 123 is deflected relative to the first lens array assembly 122, the laser beam will be deflected after being transmitted through the second lens array assembly 123. As the movement stroke of the second lens array assembly 123 changes, the angle of deviation of the laser beam also changes accordingly, so that the angle of deviation of the laser beam is controllable, that is, the field of view of the laser beam is controllable.

In some embodiments, the first lens array assembly 122 and the second lens array assembly 123 may be made of optical plastics or semiconductor materials, so that the first lens array assembly 122 and the second lens array assembly 123 can have good light transmittance and structural strength.

Referring to FIG. 3, in an embodiment, the first lens array assembly 122 includes a first transparent plate 1221 and multiple first lens units 1222. The multiple first lens units 1222 are connected to the first transparent plate 1221 and are arranged in an array, and an orthographic projection of the array formed by the multiple first lens units 1222 on a plane where the beam outlet 11a is located at least partially overlaps with the beam outlet 11a.

The second lens array assembly 123 includes a second transparent plate 1231 and multiple second lens units 1232. The multiple second lens units 1232 are all connected to the second transparent plate 1231 and are arranged in an array, and an orthographic projection of the array formed by the multiple second lens units 1232 on the plane where the beam outlet 11a is located at least partially overlaps with the beam outlet 11a.

The second lens units 1232 are in one-to-one correspondence to the first lens units 1222, and an orthographic projection of the second lens unit 1232 on the first transparent plate 1221 at least partially overlaps with the corresponding first lens unit 1222.

In the above embodiment, the first transparent plate 1221 and the second transparent plate 1231 both function as a carrier to respectively support the first lens units 1222 and the second lens units 1232. After being emitted from the beam outlet 11a, the laser beam is transmitted through the first lens units 1222 and split into a plurality of laser beams which are respectively emitted toward the corresponding second lens units 1232. When the second lens array assembly 123 is in the original position, the principal axis of the first lens unit 1222 overlaps with the principal axis of the corresponding second lens unit 1232, and the laser beam will not be deflected after being transmitted through the second lens unit 1232. After the second lens array assembly 123 is moved laterally, the principal axes of the first lens unit 1222 and the corresponding second lens unit 1232 are spaced apart and in parallel, and the laser beam will be deflected after being transmitted through the second lens unit 1232.

In some embodiments, the first lens unit 1222 and the second lens unit 1232 may both be biconvex lenses, and the first lens unit 1222 and the second lens unit 1232 have the same radius. Such a design not only facilitates the design of the movement logic of the second lens array assembly 123, but also facilitates the centralized purchasing of the first lens units 1222 and the second lens units 1232, which is conducive to the control over the cost of the laser emitter. The first lens unit 1222 has a radius of 10 μm-1 mm.

Based on the original position, the lateral translation stroke of the second lens array assembly 123 does not exceed the radius of the second lens unit 1232. The laser beam deflection formed within the lateral translation stroke can satisfy the demands for the field of view. If the lateral translation stroke of the second lens array assembly 123 is too large, it is not conducive to the miniaturization design of the laser emitter.

In some embodiments, outer edges of the first lens unit 1222 and the second lens unit 1232 have the same shape, such as a circle, a quadrilateral, a hexagon, etc., which is not limited in the disclosure.

It can be known that the orthographic projection of the array formed by the plurality of first lens units 1222 on the plane where the beam outlet 11*a* is located at least partially overlaps with the beam outlet 11*a*. That is, the orthographic projection of the array formed by the plurality of first lens units 1222 on the plane where the beam outlet 11*a* is located may either include the beam outlet 11*a* or be included in the beam outlet 11*a*. The same is true for a projection relationship between the second lens units 1232 and the beam outlet 11*a*.

In some embodiments, orthographic projections of all the first lens units 1222 on the plane where the beam outlet 11*a* is located are located within the beam outlet 11*a*. Orthographic projections of all the second lens units 1232 on the plane where the beam outlet 11*a* is located is located within the beam outlet 11*a*. Such a design can prevent the beam outlet 11*a* from blocking the first lens units 1222 and the second lens units 1232. In such cases, the first lens array assembly 122 can be located in the beam outlet 11*a*, so that the structure of the laser emitter is more compact, which is conducive to the miniaturization design.

In other embodiments, the beam outlet 11*a* is located within the orthographic projection of the array formed by the plurality of first lens units 1222 on the plane where the beam outlet 11*a* is located, and the beam outlet 11*a* is located within the orthographic projection of the array formed by the plurality of second lens units 1232 on the plane where the beam outlet 11*a* is located. Such a design can prevent the laser beam from exuding from the processing range of the first lens units 1222 and the second lens units 1232.

Referring to FIG. 3, in an embodiment, the laser deflection assembly 12 further includes a circuit board assembly 124 and an actuator 121. The circuit board assembly 124 is located outside the beam outlet 11*a* and is connected to the emitting assembly 11. The actuator 121 is located at a side of the circuit board assembly 124 facing away from the emitting assembly 11 and is connected to the circuit board assembly 124, an actuation direction of the actuator 121 is perpendicular to the center line of the laser beam emitted from the beam outlet 11*a*, and the second lens array assembly 123 is connected to the actuator 121.

In the above embodiment, the circuit board assembly 124 serves as a carrier of the actuator 121 and provides electric power for the actuator 121, so that the actuator 121 can drive the second lens array assembly 123 to move in the actuation direction. The actuation direction refers to the direction in which the actuator 121 can drive the component to move.

In some embodiments, the actuator 121 may be any one of a voice coil motor, a micro-electro-mechanical system motor, a shape memory alloy motor and an ultrasonic motor.

In the above embodiment, micro-actuators, such as the voice coil motor (VCM), the micro-electro-mechanical sys tem (MEMS) motor, the shape memory alloy (SMA) motor and the ultrasonic motor (USM) are adopted, and by utilizing its extremely small size, the occupied space can be reduced, and the second lens array assembly 123 can be effectively driven.

For example, the voice coil motor has a similar operating principle to a loudspeaker, and has the characteristics of high frequency response and high accuracy. The main principle of the voice coil motor is to control the stretching position of a leaf spring by changing the magnitude of the direct current of the coil in the voice coil motor in a permanent magnetic field, thereby driving the leaf spring to reciprocate in a certain direction (actuation direction). When the actuator 121 is a voice coil motor, the second lens array assembly 123 is located inside the actuator 121, and the outer edge of the second lens array assembly 123 is connected to the leaf spring, so that the lateral movement of the second lens array assembly 123 is driven by the reciprocation of the leaf spring.

The operating principle of the shape memory alloy motor is to generate actuation by using the expansion and contraction characteristics of shape memory alloy. The expansion and contraction direction is the actuation direction. When the actuator 121 is a shape memory alloy motor, the second lens array assembly 123 is located inside the actuator 121, and the outer edge of the second lens array assembly 123 is connected to the shape memory alloy, so that the lateral movement of the second lens array assembly 123 is driven by the expansion and contraction of the shape memory alloy.

In order to control the actuator 121, in some embodiments, the circuit board assembly 124 includes a first circuit board 1241 and a second circuit board 1242.

The first circuit board 1241 is sandwiched between the actuator 121 and the beam outlet 11*a*, the middle of the first circuit board 1241 is provided with a light transmitting hole 1241*a*, and the light transmitting hole 1241*a* is opposite to the beam outlet 11*a*. One end of the second circuit board 1242 is connected to the first circuit board 1241, and the other end of the second circuit board 1242 is connected to the emitting assembly 11.

In the above embodiment, the first circuit board 1241 is configured to carry the actuator 121 and provide electric power for the actuator 121. With the connection of the second circuit board 1242, the first circuit board 1241 can be connected to the emitting assembly 11, so that the emitting assembly 11 can be used to provide electric power for the first circuit board 1241, and thus, the structure of the laser emitter 100 is more compact, which is conducive to the miniaturization design of the depth camera.

In some embodiments, the first circuit board 1241 may be a printed circuit board, and the second circuit board 1242 may be a flexible circuit board. Thus, the actuator 121 can be carried more stably due to the structural strength of the printed circuit board, and the first circuit board 1241 can be connected to the emitting assembly 11 conveniently due to the flexibility of the flexible circuit board.

In some embodiments, the second circuit board 1242 is located outside the emitting assembly 11, which can thereby prevent the second circuit board 1242 from affecting the normal operation of the emitting assembly 11.

How the laser beam is deflected by the laser deflection assembly 12 has been described above, and the emitting assembly 11 will be described below.

Referring to FIG. 3, in an embodiment, the emitting assembly 11 may include a third circuit board 111, a frame 112 and a laser chip 113.

One end of the frame 112 is connected to a surface of the third circuit board 111, and the other end of the frame 112 is provided with the beam outlet 11a. The laser chip 113 is located in the frame 112 and is connected to the surface of the third circuit board 111.

In the above embodiment, the third circuit board 111 is configured to carry the frame 112 and the laser chip 113 and provide electric power for the laser chip 113. The frame 112 is hollow inside, and is configured to accommodate the laser chip 113. The laser chip 113 is configured to emit the laser beam, so that the laser beam penetrates through the space inside the frame 112 and is emitted from the beam outlet 11a.

In some embodiments, the third circuit board 111 may be a printed circuit board. Thus, the frame 112 and the laser chip 113 can be carried more stably due to the structural strength of the printed circuit board.

In some embodiments, the laser chip 113 may be a vertical-cavity surface-emitting laser (VCSEL). The laser chip 113 includes a substrate and a chip body. One surface of the substrate is connected to the third circuit board 111, and the other surface of the substrate is connected to the chip body.

In some embodiments, both a laser chip driver 1131 and an actuator driver 125 are connected to the third circuit board 111 and located on the same side of a bracket 22. Such a design can make the structure of the laser emitter 100 more compact, which is conducive to the miniaturization design of the depth camera.

In order to ensure all the laser beams emitted from the beam outlet 11a are collimated laser beams, in an embodiment, the emitting assembly 11 further includes a collimating lens 114. The collimating lens 114 is located between the beam outlet 11a and the laser chip 113, and the collimating lens 114 is connected to the inner wall of the frame 112. With such a design, the laser beam is collimated by the collimating lens 114 before being emitted from the beam outlet 11a, so that all the laser beams emitted from the beam outlet 11a are collimated laser beams. Thus, the interference of the laser beams can be better controlled.

Figure 4:
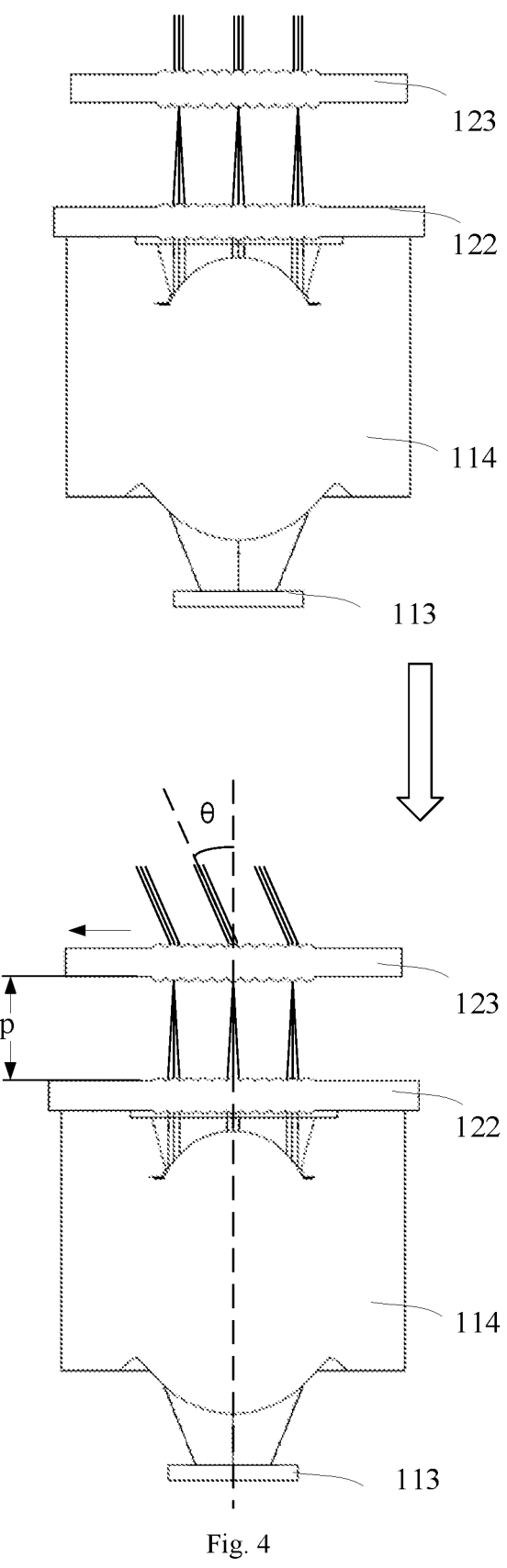
FIG. 4 is a schematic diagram of a light path of a laser beam according to an embodiment of the disclosure.

FIG. 4 is a schematic diagram of a light path of the laser beam. The operating process of the laser emitter 100 will be described below with reference to FIG. 4.

The laser beam is emitted by the laser chip 113, collimated by the collimating lens 114, and then emitted out of the emitting assembly 11 from the beam outlet 11a. The laser beam emitted out of the emitting assembly 11 is transmitted through the corresponding first lens unit 1222 and second lens unit 1232 sequentially. When the second lens array assembly 123 is in the original position, the principal axis of the first lens unit 1222 overlaps with the principal axis of the corresponding second lens unit 1232, and the laser beam will not be deflected after being transmitted through the second lens unit 1232 (with reference to the upper part of FIG. 4). After the second lens array assembly 123 is moved laterally (slightly moved leftwards in FIG. 4), the principal axes of the first lens unit 1222 and the corresponding second lens unit 1232 are spaced apart and in parallel, and the laser beam will be deflected leftwards after being transmitted through the second lens unit 1232.

According to the geometric relationship, the following relationship is satisfied between the lateral displacement stroke of the second lens array assembly 123 and the angle of deviation of the laser beam:

$$\theta = -\arctan\frac{x}{p \cdot FNO} \qquad (1)$$

θ is the angle of deviation of the laser beam, x is the transversal displacement stroke of the second lens array assembly 123, p is the distance between the corresponding first lens unit 1222 and second lens unit 1232, and FNO is the F-number of a focusing lens (not shown). The focusing lens is one of other components of the depth camera, and is configured to focus the laser beam transmitted through the second lens array assembly 123.

It can be seen that under the condition that the distance between the corresponding first lens unit 1222 and second lens unit 1232 and the F-number of the focusing lens remain unchanged, the angle of deviation of the laser beam can be controlled by controlling the transversal displacement stroke of the second lens array assembly 123.

Figure 5:
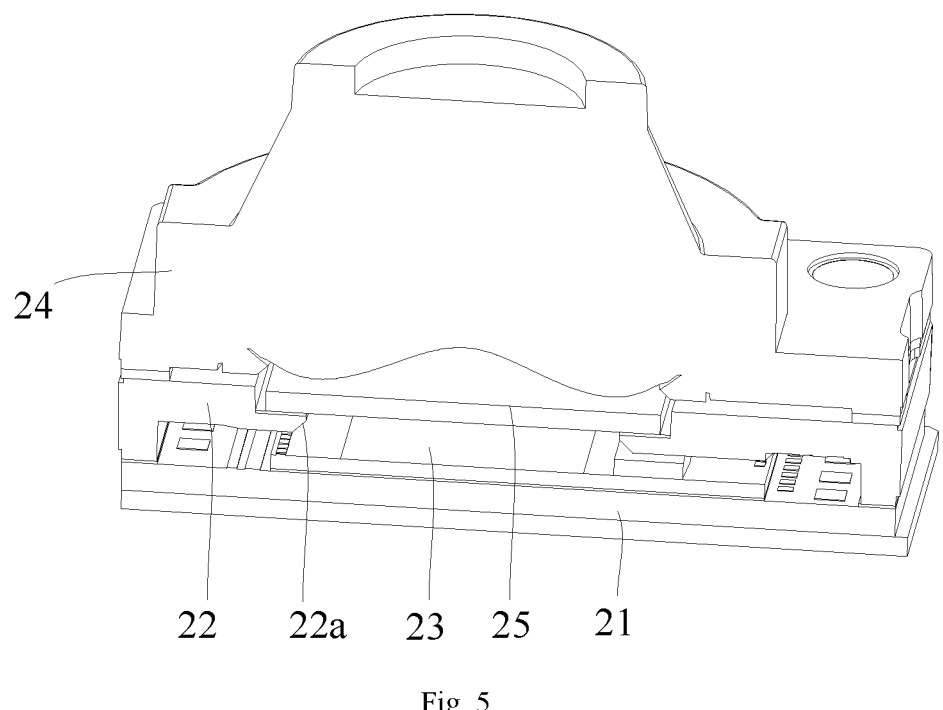
FIG. 5 is a sectional view of FIG. 1 taken along line B-B according to an embodiment of the disclosure.

The laser receiving module 200 will be described below. FIG. 5 is a sectional view of FIG. 1 taken along line B-B. With reference to FIG. 5, in an embodiment, the laser receiving module 200 includes a fourth circuit board 21, a bracket 22 and a sensor chip 23.

The bracket 22 is connected to a surface of the fourth circuit board 21, the bracket 22 is provided with a beam inlet 22a, the beam inlet 22a is located on a surface of the bracket 22 facing away from the fourth circuit board 21, and the beam inlet 22a and the beam outlet 11a have the same orientation. The sensor chip 23 is located within the bracket 22 and is connected to the surface of the fourth circuit board 21, and the sensor chip 23 is opposite to the beam inlet 22a.

In the above embodiment, the fourth circuit board 21 is configured to carry the bracket 22 and the sensor chip 23 and provide electric power for the sensor chip 23. The sensor chip 23 is configured to receive a laser beam entering from the beam inlet 22a, thereby calculating the depth of field. The bracket 22 covers the outside of the sensor chip 23, and is configured to support other components and protect the sensor chip 23.

In some embodiments, the fourth circuit board 21 may be a printed circuit board. Thus, the bracket 22 and the sensor chip 23 can be carried more stably due to the structural strength of the printed circuit board.

In some embodiments, the laser receiving module 200 may further include a receiving lens 24 and a narrowband filter 25.

The receiving lens 24 is located at the beam inlet 22a and is connected to the bracket 22. The narrowband filter 25 is located at the beam inlet 22a and is sandwiched between the receiving lens 24 and the bracket 22.

The receiving lens 24 is configured to converge the reflected laser beam, so that the laser beam can pass through the narrowband filter 25, enter the bracket 22 from the beam inlet 22a after being filtered, and thus be sensed by the sensor chip 23.

Referring to FIG. 1, in an embodiment, the depth camera further includes a reinforcing plate 300. The laser emitter 100 and the laser receiving module 200 are connected to the same surface of the reinforcing plate 300.

In the above embodiment, the reinforcing plate 300 is configured to reinforce the third circuit board 111 and the fourth circuit board 21, thereby improving the structural strength of the third circuit board 111 and the fourth circuit board 21 and further improving the structural strength of the depth camera.

In some embodiments, the laser emitter 100 and the laser receiving module 200 respectively extend to form a first flexible circuit board 410 and a second flexible circuit board 420 so as to serve as a connector, which thereby facilitates the connection with the other components in the depth camera.

In some embodiments, the first flexible circuit board 410 extending from the laser emitter 100 is connected to the third circuit board 111, and the second flexible circuit board 420 extending from the laser receiving module 200 is connected to the fourth circuit board 21. Besides, the first flexible circuit board 410 extending from the laser emitter 100 and the second flexible circuit board 420 extending from the laser receiving module 200 are located on the same side. Such a design can make the structure more compact, which is conducive to the miniaturization design of the depth camera.

Through the configured laser emitter, the depth camera provided by the embodiments of the disclosure can satisfy the requirements on large deflection angle, high scanning rate, high pointing accuracy, low loss, low power consumption and high stability. Besides, when the laser emitter is used to emit laser beams, a laser beam can be pointed randomly within a larger field of view, and the laser beam can be deflected from one angle to another angle with a small increment, and can stay on the target object for a required time.

Figure 6:
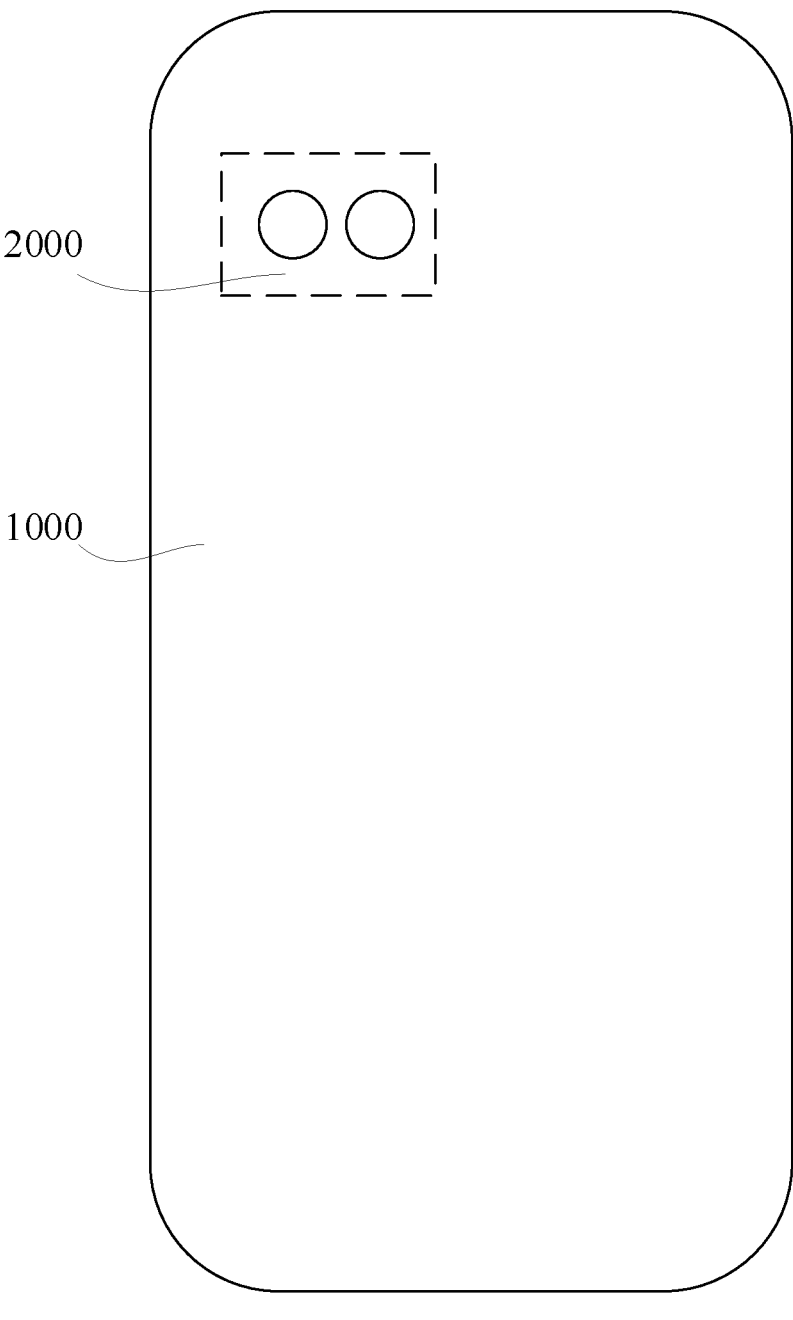
FIG. 6 is a structural schematic diagram of an electronic device according to an embodiment of the disclosure.

FIG. 6 is a structural schematic diagram of an electronic device according to the embodiments of the disclosure. The electronic device may be a mobile phone, a tablet computer or the like. Referring to FIG. 6, the electronic device includes a shell 1000 and a depth camera 2000.

The depth camera 2000 is the depth camera shown in FIG. 1-5, and the depth camera 2000 is located in the shell 1000.

The electronic device includes the depth camera shown in FIG. 1-5, and thus, can have all the beneficial effects of the depth camera, which will not be repeated here.

The above description is the optional embodiments of the disclosure and is not intended to limit the disclosure. Any modifications, equivalent substitutions and improvements made within the spirit and principles of the disclosure should be included within the protection scope of the disclosure.

The invention claimed is:

1. A laser emitter, comprising:

an emitting assembly that has a beam outlet, wherein the beam outlet is configured to emit a laser beam; and a laser deflection assembly that is at the beam outlet and is movable relative to the beam outlet, wherein the laser deflection assembly is configured to change an angle of deviation of the laser beam emitted from the beam outlet when the laser deflection assembly is translated relative to the beam outlet, and further wherein an included angle is between a translation direction of the laser deflection assembly and a center line of the laser beam emitted from the beam outlet;

wherein the laser deflection assembly comprises a first lens array assembly, a second lens array assembly, a circuit board assembly and an actuator; and further wherein:

the second lens array assembly can be translated relative to the first lens array assembly;

the circuit board assembly is connected to the emitting assembly;

the actuator is connected to the circuit board assembly; and the second lens array assembly is connected to the actuator;

wherein the circuit board assembly comprises a first circuit board and a second circuit board; and further wherein:

the first circuit board is sandwiched between the actuator and the beam outlet, a light transmitting hole is in a middle of the first circuit board, and the light transmitting hole is opposite to the beam outlet;

wherein the emitting assembly comprises a third circuit board, a laser chip and a collimating lens; and further wherein:

the laser chip is connected to the surface of the third circuit board, the collimating lens is between the beam outlet and the laser chip;

one end of the second circuit board is connected to the first circuit board, and an other end of the second circuit board is connected to the third circuit board; and the first circuit board is a printed circuit board and is configured to carry the actuator and provide electric power for the actuator, and the second circuit board is a flexible circuit board.

2. The laser emitter according to claim 1, wherein:

the first lens array assembly is at the beam outlet; and the second lens array assembly is at a side of the first lens array assembly facing away from the emitting assembly.

3. The laser emitter according to claim 1, wherein the first lens array assembly comprises a first transparent plate and multiple first lens units; and further wherein:

the multiple first lens units are connected to the first transparent plate and are arranged in an array, and an orthographic projection of the array formed by the multiple first lens units on a plane where the beam outlet is located at least partially overlaps with the beam outlet;

the second lens array assembly comprises a second transparent plate and multiple second lens units;

the multiple second lens units are connected to the second transparent plate and are arranged in an array, and an orthographic projection of the array formed by the multiple second lens units on the plane where the beam outlet is located at least partially overlaps with the beam outlet; and the multiple second lens units are in a one-to-one correspondence to the multiple first lens units, and an orthographic projection of the second lens unit on the first transparent plate at least partially overlaps with the corresponding first lens unit.

4. The laser emitter according to claim 3, wherein orthographic projections of all the first lens units on the plane where the beam outlet is located are within the beam outlet; and wherein orthographic projections of all the second lens units on the plane where the beam outlet is located are within the beam outlet.

5. The laser emitter according to claim 1, wherein:

the circuit board assembly is outside the beam outlet;

the actuator is at the side of the circuit board assembly facing away from the emitting assembly, and an actuation direction of the actuator is perpendicular to the center line of the laser beam emitted from the beam outlet.

6. The laser emitter according to claim 1, wherein the actuator is a voice coil motor, a micro-electro-mechanical system motor, a shape memory alloy motor, or an ultrasonic motor.

7. The laser emitter according to claim 1, wherein the emitting assembly comprises a frame; and further wherein:

one end of the frame is connected to a surface of the third circuit board, and an other end of the frame has the beam outlet; and the laser chip is in the frame.

8. The laser emitter according to claim 7, wherein the collimating lens is connected to an inner wall of the frame.

9. A depth camera, comprising:

a laser emitter, comprising:

an emitting assembly that has a beam outlet, wherein the beam outlet is configured to emit a laser beam; and a laser deflection assembly is at the beam outlet and is movable relative to the beam outlet, the laser deflection assembly is configured to change an angle of deviation of the laser beam emitted from the beam outlet when the laser deflection assembly is translated relative to the beam outlet, and an included angle is between a translation direction of the laser deflection assembly and a center line of the laser beam emitted from the beam outlet, wherein a laser receiving module and the laser emitter are arranged side by side;

wherein the laser deflection assembly comprises a first lens array assembly, a second lens array assembly, a circuit board assembly and an actuator; and further wherein:

the second lens array assembly can be translated relative to the first lens array assembly;

the circuit board assembly is connected to the emitting assembly;

the actuator is connected to the circuit board assembly; and the second lens array assembly is connected to the actuator;

wherein the circuit board assembly comprises a first circuit board and a second circuit board; and further wherein:

the first circuit board is sandwiched between the actuator and the beam outlet, a light transmitting hole is in a middle of the first circuit board, and the light transmitting hole is opposite to the beam outlet;

wherein the emitting assembly comprises a third circuit board, a laser chip and a collimating lens; and further wherein:

the laser chip is connected to the surface of the third circuit board, the collimating lens is between the beam outlet and the laser chip;

one end of the second circuit board is connected to the first circuit board, and an other end of the second circuit board is connected to the third circuit board; and the first circuit board is a printed circuit board and is configured to carry the actuator and provide electric power for the actuator, and the second circuit board is a flexible circuit board.

10. The depth camera according to claim 9, wherein the laser receiving module comprises a fourth circuit board, a bracket and a sensor chip; and further wherein:

the bracket is connected to a surface of the fourth circuit board, the bracket has a beam inlet, the beam inlet is on a surface of the bracket facing away from the fourth circuit board, and the beam inlet and the beam outlet have the same orientation; and the sensor chip is in the bracket and is connected to the surface of the fourth circuit board, and the sensor chip is opposite to the beam inlet.

11. The depth camera according to claim 10, wherein the laser receiving module further comprises a receiving lens and a narrowband filter; and further wherein:

the receiving lens is at the beam inlet and is connected to the bracket; and the narrowband filter is at the beam inlet and is sandwiched between the receiving lens and the bracket.

12. The depth camera according to claim 9, wherein:

the first lens array assembly is at the beam outlet; and the second lens array assembly is at a side of the first lens array assembly facing away from the emitting assembly.

13. The depth camera according to claim 9, wherein the first lens array assembly comprises a first transparent plate and multiple first lens units; and further wherein:

the multiple first lens units are connected to the first transparent plate and are arranged in an array, and an orthographic projection of the array formed by the multiple first lens units on a plane where the beam outlet is located at least partially overlaps with the beam outlet;

the second lens array assembly comprises a second transparent plate and multiple second lens units;

the multiple second lens units are connected to the second transparent plate and are arranged in an array, and an orthographic projection of the array formed by the multiple second lens units on the plane where the beam outlet is located at least partially overlaps with the beam outlet; and the multiple second lens units are in a one-to-one correspondence to the multiple first lens units, and an orthographic projection of the second lens unit on the first transparent plate at least partially overlaps with the corresponding first lens unit.

14. The depth camera according to claim 13, wherein orthographic projections of all the first lens units on the plane where the beam outlet is located are within the beam outlet; and wherein orthographic projections of all the second lens units on the plane where the beam outlet is located are within the beam outlet.

15. The depth camera according to claim 9, wherein:

the circuit board assembly is outside the beam outlet;

the actuator is at a side of the circuit board assembly facing away from the emitting assembly, and an actuation direction of the actuator is perpendicular to the center line of the laser beam emitted from the beam outlet.

16. The depth camera according to claim 9, wherein the emitting assembly comprises a frame; and further wherein:

one end of the frame is connected to a surface of the third circuit board, and an other end of the frame has the beam outlet; and the laser chip is in the frame.

17. The depth camera according to claim 16, wherein the collimating lens is connected to an inner wall of the frame.

18. An electronic device, comprising:

a shell; and a depth camera is in the shell, wherein the depth camera comprises:

a laser emitter, comprising:

an emitting assembly that has a beam outlet, wherein the beam outlet is configured to emit a laser beam; and a laser deflection assembly that is at the beam outlet and is movable relative to the beam outlet, wherein the laser deflection assembly is configured to change an angle of deviation of the laser beam emitted from the beam outlet when the laser deflection assembly is translated relative to the beam outlet, and an included angle is between a translation direction of the laser deflection assembly and a center line of the laser beam emitted from the beam outlet, wherein a laser receiving module and the laser emitter are arranged side by side;

wherein the laser deflection assembly comprises a first lens array assembly, a second lens array assembly, a circuit board assembly and an actuator; and further wherein:

the second lens array assembly can be translated relative to the first lens array assembly;

the circuit board assembly is connected to the emitting assembly;

the actuator is connected to the circuit board assembly; and the second lens array assembly is connected to the actuator;

wherein the circuit board assembly comprises a first circuit board and a second circuit board; and further wherein:

the first circuit board is sandwiched between the actuator and the beam outlet, a light transmitting hole is in a middle of the first circuit board, and the light transmitting hole is opposite to the beam outlet;

wherein the emitting assembly comprises a third circuit board, a laser chip and a collimating lens; and further wherein:

the laser chip is connected to the surface of the third circuit board, the collimating lens is between the beam outlet and the laser chip;

one end of the second circuit board is connected to the first circuit board, and an other end of the second circuit board is connected to the third circuit board; and the first circuit board is a printed circuit board and is configured to carry the actuator and provide electric power for the actuator, and the second circuit board is a flexible circuit board.

19. The laser emitter according to claim 3, wherein the lateral translation stroke of the second lens array assembly relative to its original position does not exceed the radius of the second lens unit.

20. The depth camera according to claim 13, wherein the lateral translation stroke of the second lens array assembly relative to its original position does not exceed the radius of the second lens unit.

\* \* \* \* \*